US008338893B2

(12) United States Patent
Yang

(10) Patent No.: US 8,338,893 B2
(45) Date of Patent: Dec. 25, 2012

(54) METHOD AND RESULTING STRUCTURE DRAM CELL WITH SELECTED INVERSE NARROW WIDTH EFFECT

(75) Inventor: Hae Wang Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/987,025

(22) Filed: Jan. 7, 2011

(65) Prior Publication Data
US 2011/0101464 A1 May 5, 2011

Related U.S. Application Data

(62) Division of application No. 12/238,256, filed on Sep. 25, 2008, now Pat. No. 7,880,263.

(30) Foreign Application Priority Data

Jul. 3, 2008 (CN) .......................... 2008 1 0040296

(51) Int. Cl.
*H01L 29/78* (2006.01)
*H01L 29/06* (2006.01)
(52) U.S. Cl. ...................................................... 257/368
(58) Field of Classification Search .................. 257/510, 257/68–71, 296–309, 905–908, E27.098–E27.101, 257/E27.077, 118, 224, 328–333, 466, 513, 257/594; 438/424, 524, 528, 224, 243, 433, 438/542, 270, 289, 430, 427, 437, 766
See application file for complete search history.

(56) References Cited

U.S. PATENT DOCUMENTS

| 6,348,396 B1 * | 2/2002 | Ishitsuka et al. ............... 438/424 |
| 6,524,930 B1 * | 2/2003 | Wasshuber et al. ............ 438/424 |
| 6,562,697 B1 | 5/2003 | Cho et al. |
| 6,599,810 B1 * | 7/2003 | Kepler et al. ................. 438/424 |
| 6,890,832 B1 | 5/2005 | Kerwin et al. |

(Continued)

OTHER PUBLICATIONS

Notice of Allowance for U.S. Appl. No. 12/238,256, mailed on Sep. 27, 2010, 6 pages.

(Continued)

*Primary Examiner* — Dao H Nguyen
*Assistant Examiner* — Tram H Nguyen
(74) *Attorney, Agent, or Firm* — Kilpatrick Townsend & Stockton LLP

(57) ABSTRACT

A shallow trench isolation structure for integrated circuits includes a semiconductor substrate having a trench and a buffered oxide layer overlying the semiconductor substrate. A pad nitride layer is overlying the buffered oxide layer. An implanted region is formed around a perimeter of the trench. The trench has a bottom width of less than 0.13 microns and an upper width of less than 0.13 microns. A rounded edge is surrounding a periphery of the trench. The rounded edge has a radius of curvature greater than about 0.02 um. A planarized high density plasma fill material is formed within the trench. The structure has a P-well region within the semiconductor substrate and bordering a vicinity of the trench region. A channel region is within the P-well region within the semiconductor substrate. The implanted region has an impurity concentration of more than double an amount of impurities in the channel region.

19 Claims, 6 Drawing Sheets

U.S. PATENT DOCUMENTS

| | | |
|---|---|---|
| 6,924,182 B1 | 8/2005 | Xiang et al. |
| 7,029,997 B2 | 4/2006 | Wu |
| 7,045,436 B2 | 5/2006 | Chatterjee et al. |
| 7,557,414 B2 * | 7/2009 | Suzuki et al. ............... 257/369 |
| 7,880,263 B2 | 2/2011 | Yang |
| 2004/0145011 A1 * | 7/2004 | Hsu et al. ................... 257/330 |
| 2007/0087519 A1 * | 4/2007 | Chi-Kang et al. ........... 438/424 |
| 2011/0086476 A1 * | 4/2011 | Hanson et al. .............. 438/212 |

OTHER PUBLICATIONS

Office Action of Chinese Application No. 200810040296.4, dated Mar. 19, 2010, 4 pages total (English translation not included).

Requirement for Restriction/Election for U.S. Appl. No. 12/238,256, mailed on Jul. 22, 2010, 12 pages.

* cited by examiner

METHOD AND RESULTING STRUCTURE DRAM CELL WITH SELECTED INVERSE NARROW WIDTH EFFECT

CROSS-REFERENCES TO RELATED APPLICATIONS

This application is a divisional application to U.S. patent application Ser. No. 12/238,256 filed Sep. 25, 2008, which claims priority to Chinese Application No. 200810040296.4, filed Jul. 3, 2008, commonly assigned, and incorporated herein by reference for all purposes.

BACKGROUND OF THE INVENTION

Embodiments of the present invention relate to integrated circuits and the processing for the manufacture of semiconductor devices. More particularly, embodiments of the present invention provide a method and structures for manufacturing an isolation structure for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of isolation structures for memory devices, such as dynamic random access memory integrated circuits. Such isolation structures include, among others, local oxidation of silicon, commonly called LOCOS, and shallow trench isolation, called STI. Although there have been significant improvements, such designs still have many limitations. As merely an example, these designs must become smaller and smaller but still provide electrical isolation characteristics. Additionally, these isolation structures are often difficult to manufacture and generally require complex manufacturing processes and structures. Furthermore these memory devices often have problems called inverse narrow width effects, commonly known as INWE. These and other limitations will be described in further detail throughout the present specification and more particularly below.

From the above, it is seen that an improved technique for processing semiconductor devices is desired.

SUMMARY OF THE INVENTION

Embodiments of the present invention provide techniques for processing integrated circuits. More particularly, embodiments of the present invention provide a method and structures for manufacturing an isolation structure for dynamic random access memory devices, commonly called DRAMs. But it would be recognized that the invention has a much broader range of applicability.

A specific embodiment of the present invention provides a method for a shallow trench isolation structure for integrated circuits, e.g., dynamic random access memory device. The method includes providing a semiconductor substrate, e.g., silicon wafer. The method forms a buffered oxide layer overlying the semiconductor substrate and forms a pad nitride layer overlying the buffered oxide layer. The method also includes patterning the pad nitride layer to expose a portion of the semiconductor substrate corresponding to a trench region. The method implants P-type material using the patterned pad nitride layer using an angle of implanting of less than 45 degrees to form an implanted region around a perimeter of the trench region. The method includes forming a blanket layer of oxide material overlying the patterned nitride layer and implanted region of the semiconductor substrate. The method selectively removes the oxide material to leave side wall spacers on edges of the pad nitride layer facing the exposed portion of the semiconductor substrate. The method uses the patterned pad nitride and side wall spacers as a protective layer and etches the exposed portion of the semiconductor substrate to form a trench region within the semiconductor substrate. Preferably, the trench region has a depth of no greater than 2500 Angstroms and a bottom width of at less than 0.13 microns and an upper width of less than 0.13 microns. The side wall spacers are selectively removed on edges of the pad nitride. The method performs a soft etch on edges of the trench region to round the edges. Preferably, sharp edges (e.g., 90 degree corners or thin corner regions (e.g., 0.01 um microns and less)) are reduced to round edges on the periphery of the trench region. The method performs a high density plasma chemical vapor deposition process to fill the trench region with a dielectric material. The method planarizes the high density plasma chemical vapor deposition process dielectric material until a portion of the patterned pad nitride layer has been exposed. The patterned pad nitride layer is stripped. The method forms P-well regions within the semiconductor substrate and forms channel regions using boron bearing species within the semiconductor substrate.

An alternative specific embodiment of the present invention provides a method for a shallow trench isolation structure for integrated circuits, e.g., dynamic random access memory device. The method includes providing a semiconductor substrate, e.g., silicon wafer. The method forms a buffered oxide layer overlying the semiconductor substrate and forms a pad nitride layer overlying the buffered oxide layer. The method also includes patterning the pad nitride layer to expose a portion of the semiconductor substrate corresponding to a trench region. Preferably, the trench region has a bottom width of less than 0.13 microns and an upper width of less than 0.13 microns. The method implants P-type material using the patterned pad nitride layer using an angle of implanting of less than 45 degrees to form an implanted region (e.g., continuous) around a perimeter of the trench region. The method includes forming a blanket layer of oxide material overlying the patterned nitride layer and implanted region of the semiconductor substrate. The method selectively removes the oxide material to leave side wall spacers on edges of the pad nitride layer facing the exposed portion of the semiconductor substrate. The method uses the patterned pad nitride and side wall spacers as a protective layer to etch the exposed portion of the semiconductor substrate to form a trench region within the semiconductor substrate. The side wall spacers are selectively removed on edges of the pad nitride. The method performs a soft etch on edges of the trench region to round the edges, which include a radius of curvature greater than about 0.02 um. The method performs a high density plasma chemical vapor deposition process to fill the trench region and planarizes the high density plasma chemical vapor deposition process to expose the patterned pad nitride layer. The patterned pad nitride layer is stripped. The method forms P-well regions within the semiconductor substrate and forms channel regions using boron bearing species within the semiconductor substrate. Preferably, the implanted region has a selected concentration of more than double an amount of impurities implanted into the channel region.

In yet an alternative specific embodiment, a shallow trench isolation structure for integrated circuits includes a semiconductor substrate and a buffered oxide layer overlying the semiconductor substrate. A pad nitride layer is overlying the buffered oxide layer. An implanted region is formed around a perimeter of the trench region. A trench region is formed within the semiconductor substrate. The trench region has a bottom width of less than 0.13 microns and an upper width of less than 0.13 microns. A rounded edge region is within a portion of the semiconductor substrate surrounding a periphery of the trench region. The rounded edges have a radius of curvature greater than about 0.02 um. A planarized high density plasma fill material is formed within the trench region. The structure has a P-well region within the semiconductor substrate and bordering a vicinity of the trench region. A channel region is within the P-well region within the semiconductor substrate. The implanted region has an impurity concentration of more than double an amount of impurities in the channel region.

Embodiments of the present invention can provide many benefits over conventional techniques. For example, embodiments of the present technique provide an easy to use process that relies upon conventional technology. In some embodiments, a method provides higher device yields in dies per wafer. Additionally, the method provides a process that is compatible with conventional process technology without substantial modifications to conventional equipment and processes. Preferably, embodiments of the invention provide for improved process integration for design rules of 0.13 microns and less. Additionally, embodiments of the invention provide isolation structures that may achieve improved electrical characteristics. Preferably, embodiments of the invention may prevent inverse narrow width effects, commonly called INWE. In certain embodiments, embodiments of the invention provides for a higher threshold voltage under a small amount of channel dosages. The higher amount of channel dosages in conventional devices causes higher electric fields between a storage node and channel of a dynamic random access memory cell. The higher electric fields are often undesirable. The present invention may achieve lower electric fields between the storage node and channel, which provides improved data retention. Depending upon the embodiment, one or more of these benefits may be achieved. These and other benefits will be described in more throughout the present specification and more particularly below.

Various additional embodiments, features and advantages of the present invention can be more fully appreciated with reference to the detailed description and accompanying drawings that follow.

DETAILED DESCRIPTION OF THE INVENTION

Figure 1:
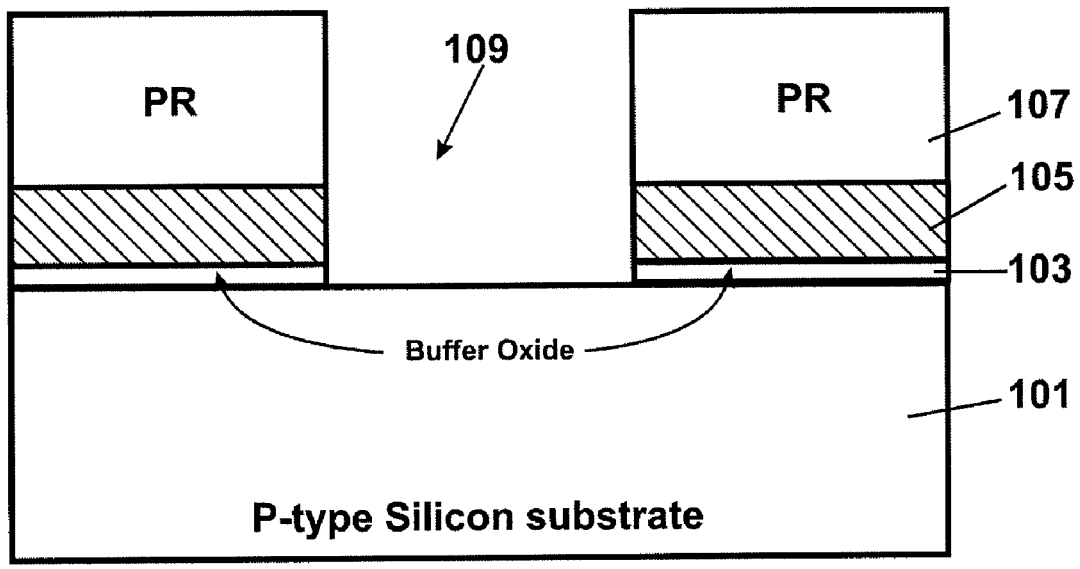
FIGS. 1 through 10 are simplified diagrams illustrating methods for fabricating an isolation structure for a dynamic random access memory device according to embodiments of the present invention.

Embodiments of the present invention provide techniques for processing integrated circuits. More particularly, embodiments of the invention provide a method and structures for manufacturing an isolation structure for dynamic random access memory devices, commonly called DRAMs. But it would be recognized that the invention has a much broader range of applicability.

A method for fabricating a shallow trench isolation structure for integrated circuits can be briefly outlined below.

1. Provide a semiconductor substrate, e.g., silicon wafer;
2. Form a buffered oxide layer overlying the semiconductor substrate;
3. Form a pad nitride layer overlying the buffered oxide layer;
4. Pattern the pad nitride layer to expose a portion of the semiconductor substrate corresponding to a trench region;
5. Implant P-type material using the patterned pad nitride layer as a masking material at an angle of implanting of less than 45 degrees to form an implanted region around a perimeter of the trench region;
6. Form a blanket layer of an oxide material overlying the patterned nitride layer and the implanted region of the semiconductor substrate;
7. Selectively remove the blanket layer of the oxide material to leave side wall spacers on edges of the pad nitride layer facing the exposed portion of the semiconductor substrate;
8. Use the patterned pad nitride and the side wall spacers as a protective layer;
9. Etch the exposed portion of the semiconductor substrate to form a trench region within the semiconductor substrate while suing the patterned pad nitride and the side wall spacers as the protective layer;
10. Selectively remove the side wall spacers on edges of the pad nitride;
11. Perform a soft etch on edges of the trench region to round the edges, which include a radius of curvature greater than about 0.02 um;
12. Perform a high density plasma chemical vapor deposition process to fill the trench region;
13. Planarize the high density plasma chemical vapor deposition process until a portion of the patterned pad nitride layer has been exposed;
14. Strip the patterned pad nitride layer;
15. Form P-well regions within the semiconductor substrate;

16. Form channel regions using boron bearing species within the semiconductor substrate, whereupon the implanted region has a selected concentration of more than double an amount of impurities implanted into the channel region; and 17. Perform other steps, as desired.

The above sequence of steps provides a method according to an embodiment of the present invention. As shown, the method uses a combination of steps including a way of forming an isolation region of a dynamic random access memory device. Of course, other alternatives can also be provided where steps are added, one or more steps are removed, or one or more steps are provided in a different sequence without departing from the scope of the claims herein. Further details of the present method can be found throughout the present specification and more particularly below.

FIGS. 1 through 10 are simplified diagrams illustrating methods for fabricating an isolation structure for a dynamic random access memory device according to embodiments of the present invention. These diagrams are merely examples that should not unduly limit the scope of the claims herein. One of ordinary skill in the art would recognize other variations, modifications, and alternatives. As shown in FIG. 1, the method includes providing a semiconductor substrate 101, e.g., silicon wafer, silicon on insulator. The method forms a buffered oxide layer 103 (e.g., thermal oxide) overlying the semiconductor substrate and forms a pad nitride layer 105 (or other like material) overlying the buffered oxide layer. The method also includes patterning the pad nitride layer to expose a portion 109 of the semiconductor substrate corresponding to a trench region. The patterning process uses photolithography layer 107, which has been provided using well known techniques.

Figure 2:
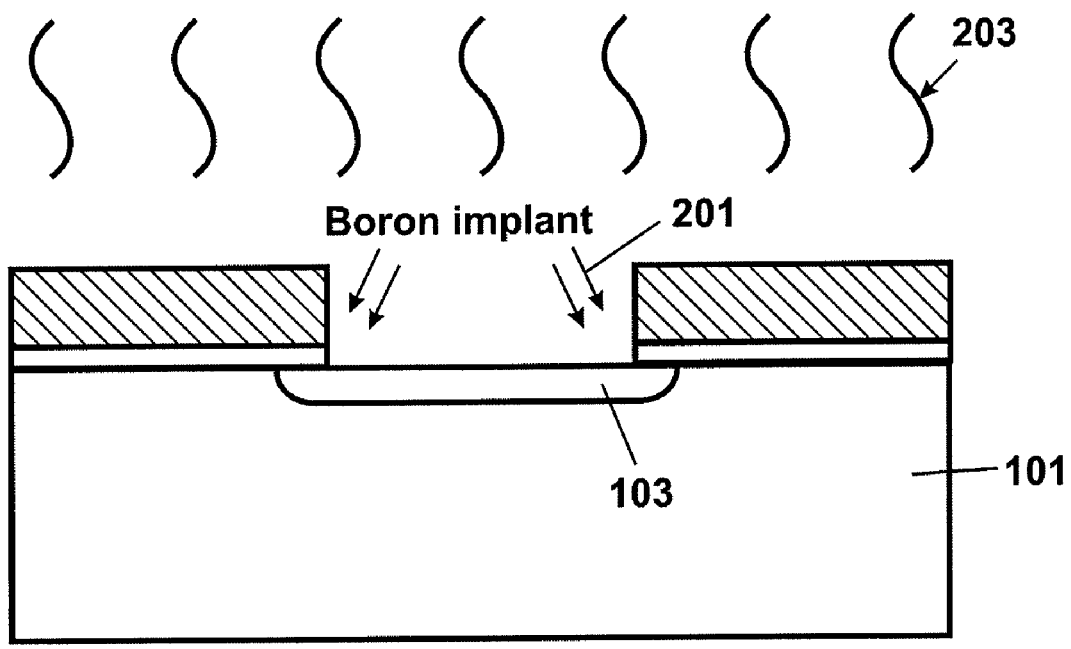

Referring to FIG. 2, the method implants P-type material 201 using the patterned pad nitride layer as a masking layer. Preferably, the method uses an angle of implanting of less than 45 degrees or others to form an implanted region 103 around a perimeter of the trench region. Preferably, implanting of the P-type material uses boron bearing impurities at a concentration ranging from about 1.0e11 to about 5.0e13 atoms/cm$^2$ and at 30 keV or other suitable energy. Preferably, the implanted region is subjected to annealing, including rapid thermal annealing and/or furnace annealing 203. The rapid thermal anneal is provided at a temperature of about 850 degrees Celsius to about 1050 degrees Celsius, but can be others. Furnace annealing occurs at about 850 degrees C. for about 10 to about 20 minutes.

Figure 3:
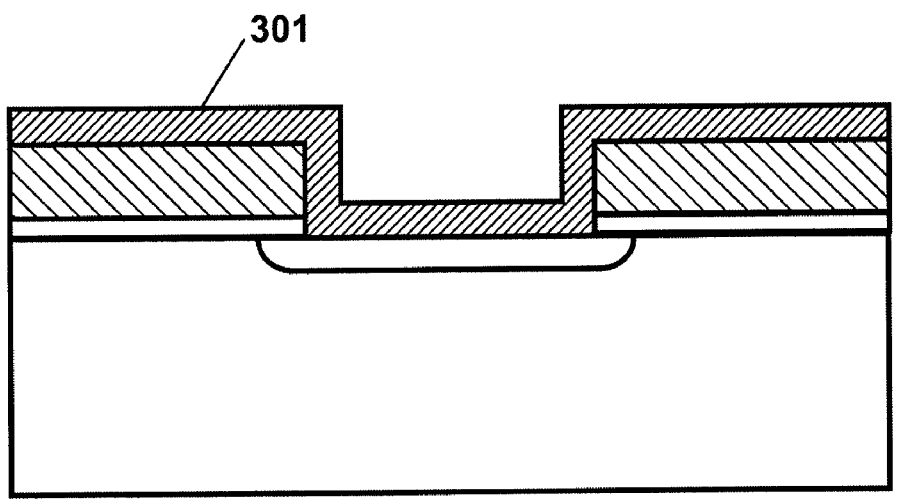
Figure 4:
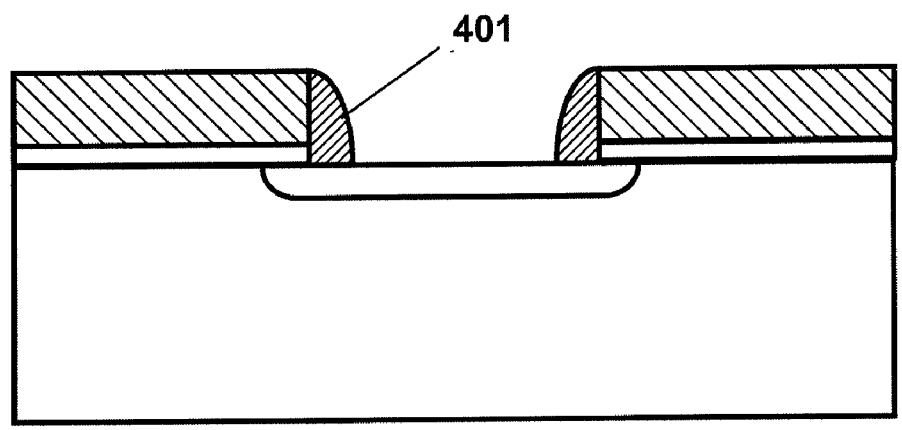

The method includes forming a blanket oxide layer 301 overlying the patterned pad nitride layer and the implanted region of the semiconductor substrate, as shown in FIG. 3. The blanket oxide layer is formed using a CVD process and has a thickness of about 100 Angstroms to about 500 Angstroms. The method selectively removes the blanket oxide layer to form side wall spacers 401 (FIG. 4) on edges of the patterned pad nitride layer facing the exposed portion of the semiconductor substrate. Preferably, an anisotropic etching technique can been used. The anisotropic etching techniques use suitable bearing species under a plasma environment.

Figure 5:
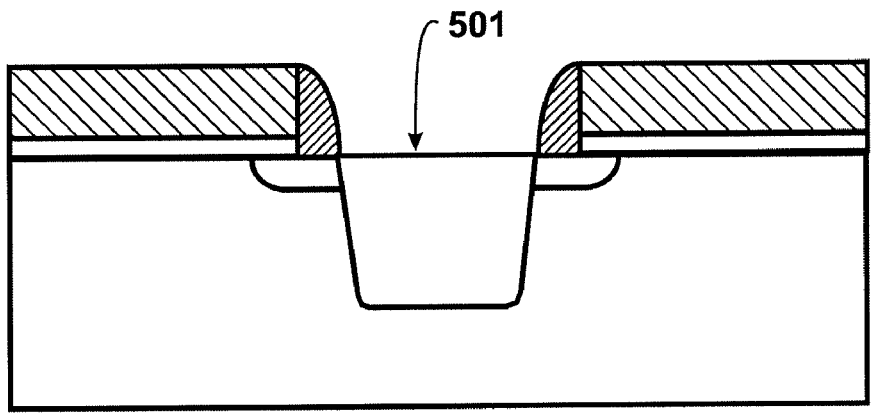
Figure 6:
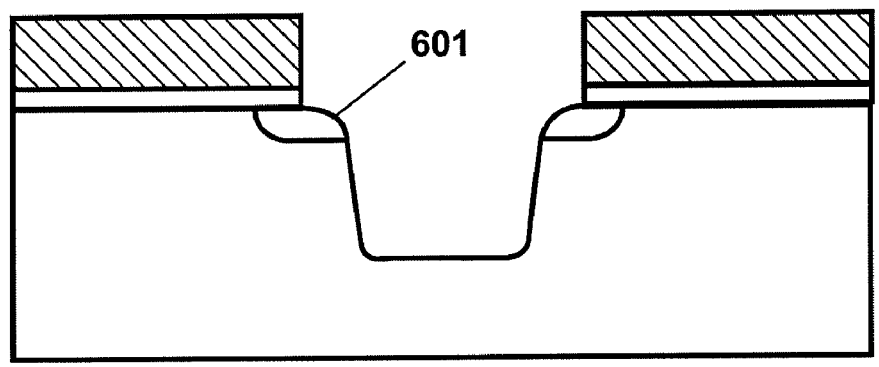

The method uses the patterned pad nitride and side wall spacers as a protective layer to etch the exposed portion 501 of the semiconductor substrate to form a trench region within the semiconductor substrate, as illustrated by FIG. 5. Preferably, the trench region has a depth of no greater than 2500 Angstroms and a bottom width of less than 0.13 microns and an upper width of less than 0.13 microns. The side wall spacers are selectively removed on edges of the pad nitride, as shown in FIG. 6. Next, the method performs a soft etch on edges of the trench region to round the edges, which include a radius of curvature greater than about 0.02 um in a specific embodiment. The soft etch is performed using an anisotropic dry etch process.

Figure 7:
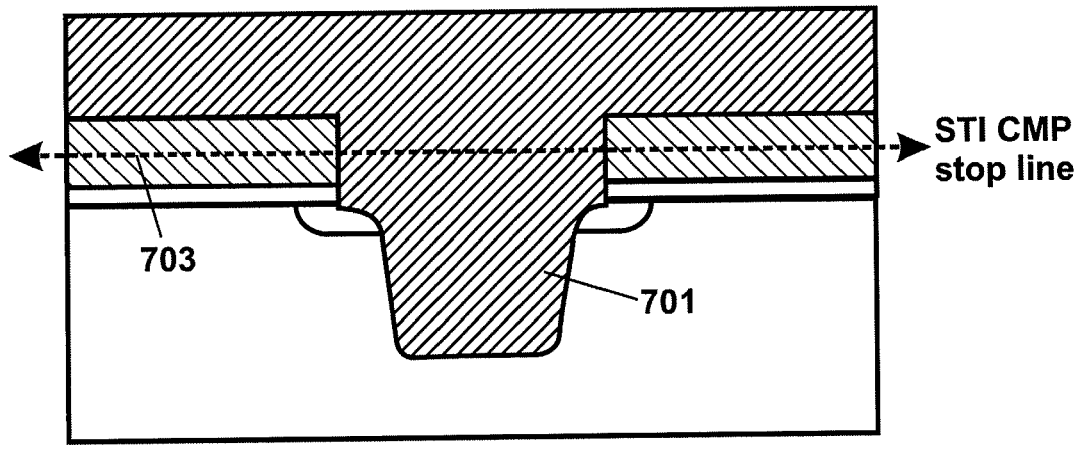
Figure 8:
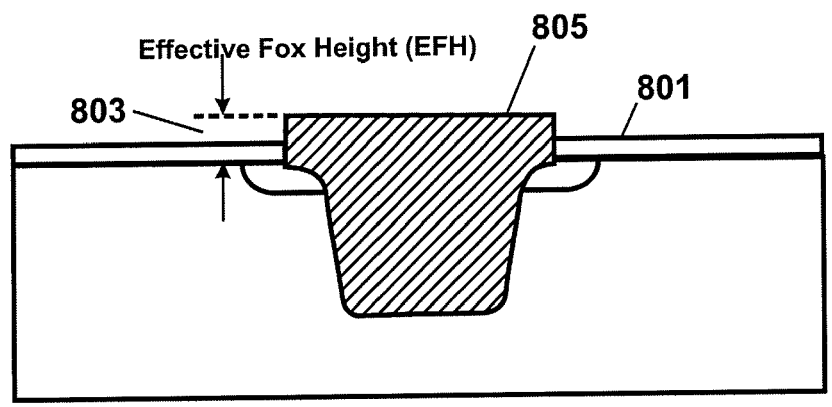

Referring to FIG. 7, the method fills the trench region with a dielectric material. In a specific embodiment, the method performs a high density plasma chemical vapor deposition (HDP-CVD) process to fill the trench region 701 with the dielectric material. The dielectric material can be any suitable insulating material such as silicon oxide, and others. Reference numeral 703 illustrates a region where a chemical mechanical polishing process stops. Next, the method planarizes via chemical mechanical polishing the insulating layer from the high density plasma chemical vapor deposition process to expose the patterned pad nitride layer. The patterned pad nitride layer is then stripped. As shown, the insulating fill material has an effective height 803 from the substrate surface, which is higher than the pad oxide layer. That is, surface region 805 of the insulating fill material protrudes at an elevation above the surface region 801 of the buffered oxide layer.

Figure 9:
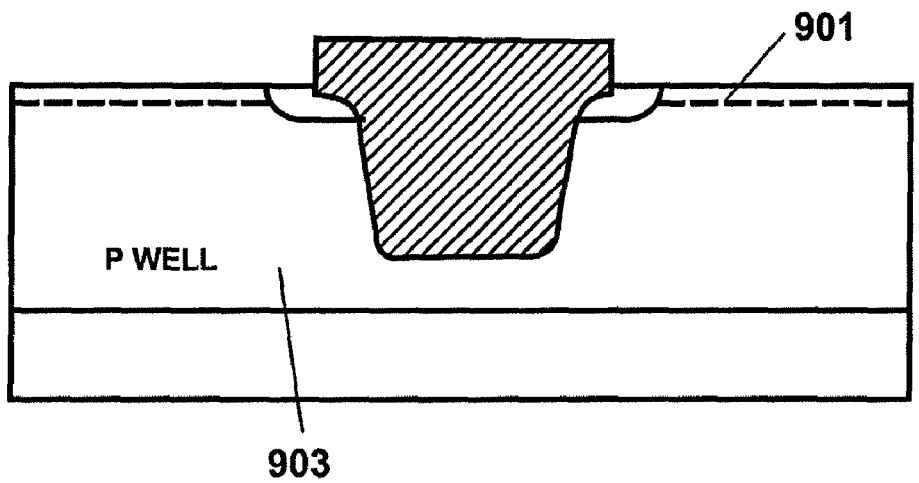
Figure 10:
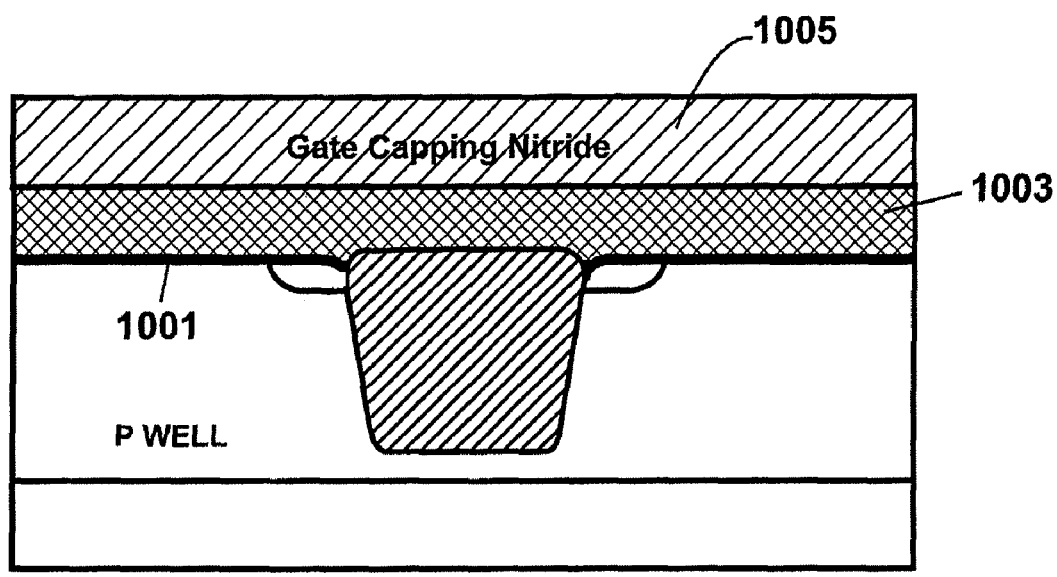

Referring to FIG. 9, the method forms P-well regions 903 within the semiconductor substrate. In a specific embodiment, the P-well regions are formed using a boron bearing species that is provided with $10 \times 10^{12}$ atoms/cm$^2$ at an energy of about 150 to 250 keV. The method also forms channel regions 901 using the boron bearing species within the semiconductor substrate. In a specific embodiment, the channel regions are provided with a concentration of about $1.5 \times 10^{13}$ atoms/cm$^2$ at an energy of ranging from about 30 keV to about 40 keV. Preferably, the implanted region has a selected concentration of more than double an amount of impurities implanted into the channel region. The method includes a gate oxide pre-cleaning process, which is followed by thermal oxidation for the gate oxide layer 1001. A gate electrode region 1003 is overlying the gate oxide layer. A nitride capping layer 1005 is formed overlying the gate electrode region. Other steps are used to finish the semiconductor integrated circuit. Details of a top-view diagram of the structure of FIG. 10 are provided below.

Figure 11:
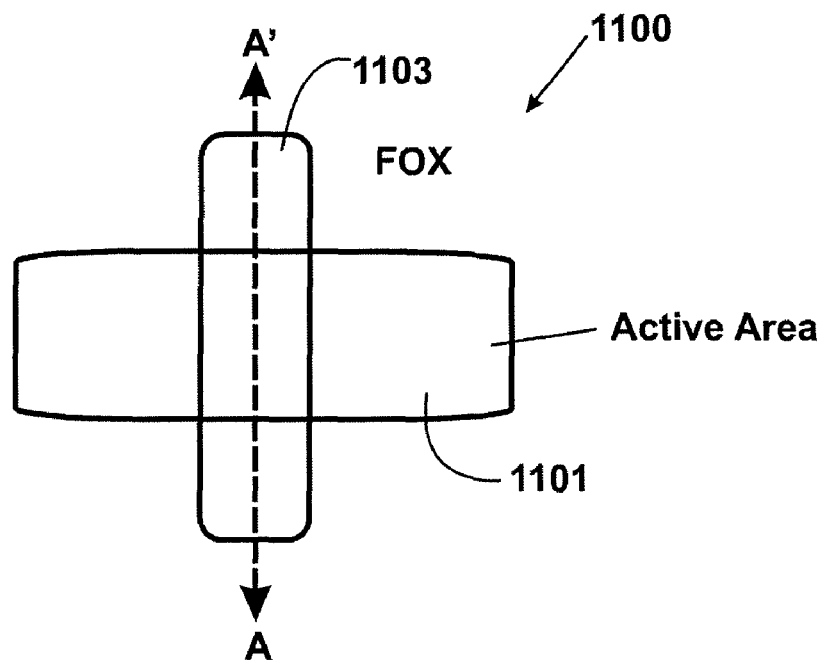
FIG. 11 is a simplified top-view diagram of an isolation structure according to an embodiment of the present invention.

FIG. 11 is a simplified top-view diagram 1100 of an isolation structure according to an embodiment of the present invention. This diagram is merely an example that should not unduly limit the scope of the claims herein. One of ordinary skill in the art would recognize other variations, modifications, and alternatives. As shown, the isolation structure 1100 surrounds active area 1101. A gate electrode 1103 traverses across the active area and a portion of the isolation structure. Reference line A to A' illustrates a cross-sectional view of the prior drawings. The present method provides a resulting device that is substantially free from limitations of conventional techniques.

Figure 12:
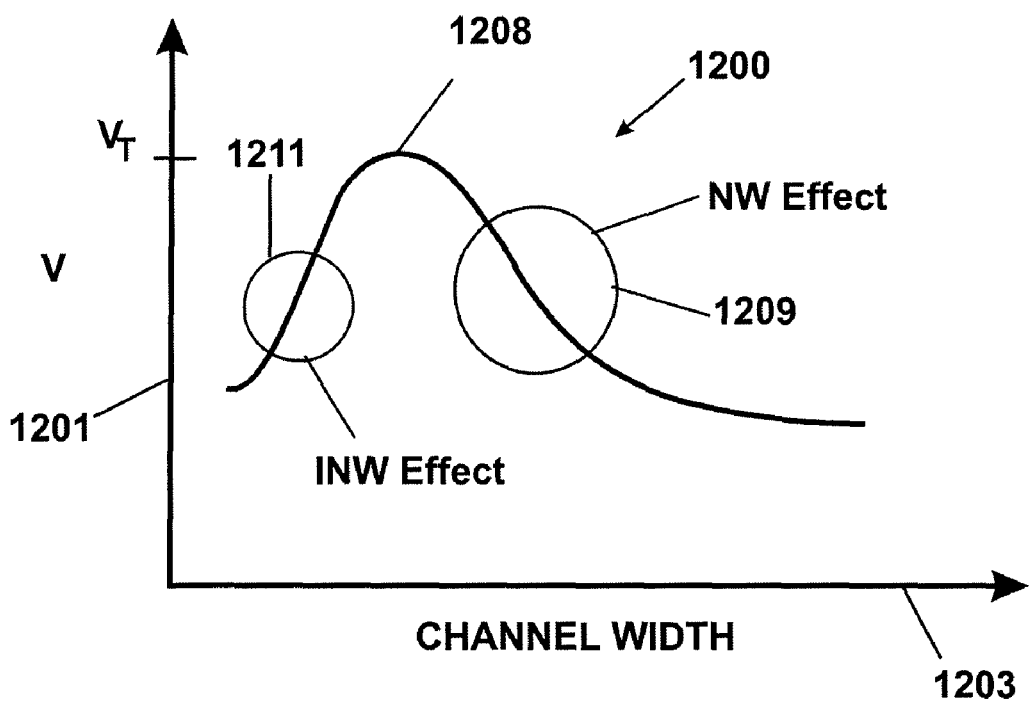
FIG. 12 is a simplified diagram of a plot of threshold voltage against channel width for a dynamic random access memory cell according to an embodiment of the present invention

FIG. 12 is a simplified diagram of a plot 1200 of threshold voltage against channel width for a dynamic random access memory cell according to an embodiment of the present invention. This diagram is merely an example that should not unduly limit the scope of the claims herein. One of ordinary skill in the art would recognize other variations, modifications, and alternatives. As shown, the diagram includes voltage along a vertical axis 1201 plotted against channel width in a horizontal axis 1203. The resulting structure operates at a voltage threshold Vt 1208 and does not operate in an inverse narrow width effect region 1211 or narrow width effect region 1209, which are characterized by lower voltage valuations. Preferably, the present implanted region maintains a threshold voltage of a resulting transistor of about 200 millivolt and free from an inverse narrow width effect influence.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An isolation structure for a semiconductor device comprising:
   a semiconductor substrate having at least one trench formed in an active area of the semiconductor substrate, the semiconductor substrate is characterized by a first conductivity type;
   a buffered oxide layer overlying the semiconductor substrate;
   a pad nitride layer overlying the buffered oxide layer;
   an implanted region around a perimeter of the trench, the implanted region having dopants of the first conductivity type and a higher dopant concentration than the semiconductor substrate;
   a P-well region surrounding a perimeter of the at least one trench region; and
   a channel region within the P-well region and adjacent to the trench
   wherein the at least one trench includes a bottom width of less than 0.13 microns and an upper width of less than 0.13 microns; and
   wherein the at least one trench includes a periphery having a rounded edge having a radius of curvature greater than about 0.02 um.

2. The structure of claim 1, wherein the at least one trench comprises a depth of no greater than 2500 Angstroms.

3. The structure of claim 1, wherein the at least one trench comprises a dielectric material.

4. The structure of claim 1, wherein the implanted region has an impurity concentration that is more than double an amount of impurities in the channel region.

5. The structure of claim 1 further comprising a gate oxide layer overlying the P-well region.

6. The structure of claim 5 further comprising:
   a gate electrode layer overlying the gate oxide layer; and
   a nitride capping layer overlying the gate electrode layer.

7. An integrated circuit device comprising:
   a semiconductor substrate having a trench formed in an active area of the semiconductor substrate;
   a buffered oxide layer overlying the semiconductor substrate;
   a pad nitride layer overlying the buffered oxide layer;
   an implanted region around a perimeter of the trench;
   a P-well region within the semiconductor substrate and bordering a vicinity of the trench; and
   a channel region within the P-well region and adjacent to the trench;
   wherein the implanted region has an impurity concentration that is more than double an amount of impurities in the channel region.

8. The integrated circuit device of claim 7, wherein the impurity comprises a P-type material.

9. The integrated circuit device of claim 7, wherein the trench comprises a depth of no greater than 2500 Angstroms, a bottom width of less than 0.13 microns and an upper width of less than 0.13 microns.

10. The integrated circuit device of claim 7, wherein the channel region comprises a channel width between a first width and a second width, the first width being associated with an inverse narrow width effect and the second width being associated with a narrow width effect.

11. The integrated circuit device of claim 7, wherein the implanted region maintains a threshold voltage of a resulting transistor of about 200 millivolts.

12. The integrated circuit device of claim 7, wherein the trench comprises a periphery having a soft edge having a radius of curvature greater than about 0.02 um.

13. The integrated circuit device of claim 7 further comprising a gate oxide layer overlying the P-well region.

14. The integrated circuit device of claim 13 further comprising:
   a gate electrode layer overlying the gate oxide layer; and
   a nitride capping layer overlying the gate electrode layer.

15. An integrated circuit device comprising:
   a semiconductor substrate having a trench formed in an active area of the semiconductor substrate;
   a buffered oxide layer overlying the semiconductor substrate;
   a pad nitride layer overlying the buffered oxide layer;
   an implanted region around a perimeter of the trench;
   a channel region within the semiconductor substrate and adjacent to the trench; and
   wherein the channel region comprises a channel width between a first width and a second width, the first width being associated with an inverse narrow width effect and the second width being associated with a narrow width effect.

16. The integrated circuit device of claim 15, wherein the semiconductor substrate is characterized by a first conductivity type and the implanted region comprises dopants of the first conductivity type and a higher dopant concentration than the semiconductor substrate.

17. The integrated circuit device of claim 15, wherein the integrated circuit device of claim 8, wherein the trench comprises a periphery having a soft edge having a radius of curvature greater than about 0.02 um.

18. The integrated circuit device of claim 15, wherein the implanted region maintains a threshold voltage of a resulting transistor of about 200 millivolts.

19. The integrated circuit device of claim 15, further comprising:
   a gate electrode layer overlying the gate oxide layer; and
   a nitride capping layer overlying the gate electrode layer.

* * * * *